United States Patent [19]

Sandler

[11] 4,175,239
[45] Nov. 20, 1979

[54] DETECTION MEANS FOR TOUCH CONTROL SWITCHES

[75] Inventor: Louis M. Sandler, North Reading, Mass.

[73] Assignee: P. R. Mallory & Co. Inc., Indianapolis, Ind.

[21] Appl. No.: 895,755

[22] Filed: Apr. 12, 1978

[51] Int. Cl.² .......................................... H01H 35/00
[52] U.S. Cl. ................................. 307/116; 361/181; 331/65
[58] Field of Search .............................. 307/116, 308; 340/365 C; 361/181, 179; 324/65 R; 200/DIG. 1; 328/5; 331/65

[56] References Cited

U.S. PATENT DOCUMENTS

| 3,492,440 | 1/1970 | Cerbone | 340/365 C X |
| 3,549,905 | 12/1970 | Johnson | 361/181 X |
| 3,581,124 | 5/1971 | Flores | 340/365 C X |
| 3,621,307 | 11/1971 | Raven | 361/181 X |
| 3,958,239 | 5/1976 | Green | 340/365 C X |

Primary Examiner—L. T. Hix
Assistant Examiner—James L. Dwyer
Attorney, Agent, or Firm—Hoffmann, Meyer & Coles

[57] ABSTRACT

In a touch control system including one or more touch sensitive devices which capacitively transmit a relatively large electrical signal when not touched and transmit a relatively small electrical signal when touched an improved means for detecting the touch and no-touch conditions of the touch sensitive devices includes a comparator having positive feedback associated therewith. By increasing or decreasing the positive feedback the touch control system is operable either asynchronously or synchronously with an external control system. Furthermore, a plurality of touch sensitive devices may be multiplexed utilizing a single detection means constructed in accordance with the invention disclosed herein while requiring a relatively low voltage drive signal.

14 Claims, 5 Drawing Figures

DETECTION MEANS FOR TOUCH CONTROL SWITCHES

BACKGROUND OF THE INVENTION

1. Field of the Invention

The present invention relates to touch control systems of the type which include at least one touch sensitive device which capacitively transmits a relatively large electrical drive signal when not touched and transmits a relatively small electrical signal when touched and means for detecting the touch and no-touch conditions of the touch sensitive devices. Such touch control systems are commonly used in conjunction with other control circuitry to activate and/or deactivate functions of an apparatus.

Generally speaking, the improved detection means of the present invention utilizes a high gain voltage comparator having positive feedback associated therewith which allows the multiplexing of a plurality of touch sensitive devices to such detection means at low drive voltages and which may be operable either asynchronously or synchronously with other control circuitry.

2. Description of the Prior Art

In substantially all touch control systems it is necessary that the touch and no-touch conditions of touch sensitive devices be distinguishable and detectable to control a desired function. Accordingly, the detection means must distinguish between the voltage amplitude of an electrical drive signal where there is a no-touch condition and the voltage amplitude where there is a touch condition. It is therefore desirable that the detection means include devices with precisely defined thresholds which will clearly and discretely detect the difference between large and small electrical signals. Furthermore, it would be desirable that the detection means have a high voltage gain so that low voltage drive signals may be utilized and a plurality of touch sensitive devices may be multiplexed to a single detection means without requiring a significantly high drive voltage.

Previous touch control systems have utilized P-channel metal oxide semiconductors (PMOS) and complementary metal oxide semiconductors (CMOS) as threshold detection devices (See Walter R. Spofford's copending application, Ser. No. 762,779 entitled "An Implemental Means For A Touch Control System"). However, PMOS devices do not exhibit clean threshold characteristics, they have a low voltage gain, and in general they vary widely from device to device making reproducibility of such devices on a large scale with uniform characteristics very difficult. Accordingly, PMOS devices when utilized in touch control systems perform inadequately and inefficiently and thereby result in decreased reliability and increased cost of the overall touch control system. Furthermore, because of the low voltage gain, very high drive voltages are required when multiplexing a plurality of touch sensitive devices to a single detection means including PMOS devices.

As disclosed by Walter R. Spofford in his aforementioned copending application, by utilizing multiple input inverting logic gates which include CMOS devices three touch sensitive devices may be detected utilizing a detection means which is a single integrated circuit package. The integrated circuit package is capable of being manufactured such that each of the CMOS devices exhibits uniform characteristics and therefore at least for the detection of three touch sensitive devices the aforementioned problems associated with PMOS devices are overcome. However, CMOS devices exhibit low voltage gain, similar to PMOS devices, which limits their use in a multiplexed detection scheme.

When adapting a touch control system to a larger control system requiring asynchronous operation the detected touch condition must be remembered. When adapting a touch control system to a larger control system requiring synchronous operation the proper detector state, i.e. touch or no-touch, must be maintained for some minimum pulse width. For either or both of these operating conditions, MOS devices require additional circuitry and/or the imposition of greater restrictions on their thresholds to make them adaptable to the desired mode of operation.

SUMMARY OF THE INVENTION

In accordance with the present invention in its broadest concept, there is provided an improved means for detecting the touch and no-touch conditions of at least one touch sensitive device of a touch control system which is reproducible, provides solutions to both the asynchronous and synchronous timing problems described hereinabove, and allows multiplexing of a plurality of touch sensitive switching devices utilizing a relatively low drive voltage.

Accordingly, it is a feature of the present invention to provide a touch control system of the type which includes at least one touch sensitive device which capacitively transmits a relatively large electrical signal when not touched and transmits a relatively small electrical signal when touched and an improved means for detecting the touch and no-touch conditions of the touch sensitive device wherein the detection means has a high voltage gain associated therewith which allows for the multiplexing of a plurality of touch sensitive devices by requiring a relatively low drive voltage.

It is another feature of the present invention to provide an improved means for detecting the touch and no-touch conditions of touch sensitive devices of a touch control system wherein the detection means includes a comparator having a precisely defined threshold which will clearly and discretely detect touch and no-touch conditions of the touch sensitive devices.

It is yet another feature of the present invention to provide an improved means for detecting the touch and no-touch conditions of touch sensitive devices of a touch control system wherein the detection means includes positive feedback which may be either large or small to define a time period for a no-touch state of a comparator whereby the touch control system is operable either asynchronously or synchronously.

It is still another feature of the present invention to provide a method of detecting a touch condition of at least one touch sensitive device of a touch control system which includes the steps of comparing a voltage of an electrical signal capacitively transmitted by the touch sensitive device to a predetermined reference voltage, assuming a state indicative of a no-touch condition of the touch sensitive device when the voltage of the electrical signal exceeds the predetermined reference voltage, assuming a state indicative of a touch condition of the touch sensitive device when the voltage of the electrical signal is within the predetermined reference voltage, and defining a time period for the assumed state which is indicative of the no-touch condition of the touch sensitive device.

Other features and advantages of the present invention will be apparent from the following detailed description of a preferred embodiment thereof, which description should be considered in conjunction with the accompanying drawings.

DESCRIPTION OF THE PREFERRED EMBODIMENT

Figure 1:
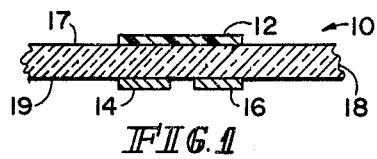
FIG. 1 is a cross-sectional view of a conventional touch sensitive device.

Referring to the above described figures and more particularly to FIG. 1, a touch sensitive device 10 includes a dielectric material 18 which may comprise glass, such as the NESA ® and NESATRON ® glass produced by Pittsburgh Plate Glass; a metallic coating of tin oxide 12 disposed on a surface 17 of the dielectric material 18, and two metal strips 14 and 16 disposed in spaced parallel relationship to the coating of tin oxide 12 on another surface 19 of the dielectric material 18. In operation, metal strip 14 is capacitively coupled to the coating of tin oxide 12 and the coating of tin oxide 12 is capacitively coupled to metal strip 16. A high frequency electrical signal is applied to the metal strip 14 which is capacitively transmitted to the coating of tin oxide 12 and the other metal strip 16 in that order. Capacitances are formed via the glass dielectric material 18 and the close proximity of the conductive plates 12, 14 and 16. When the coating of tin oxide 12 is touched, the electrical signal will be shunted thereby substantially reducing the output signal from touch sensitive device 10. While the above described touch sensitive device 10 is typically of the type used in the art it is not intended that the invention disclosed herein be limited to its use with a touch control system which includes this type of touch sensitive device. In fact, as will be obvious to those skilled in the art after reading this disclosure, the present invention may be used with various other touch sensitive devices without departing from the essence of the invention.

Figure 2:
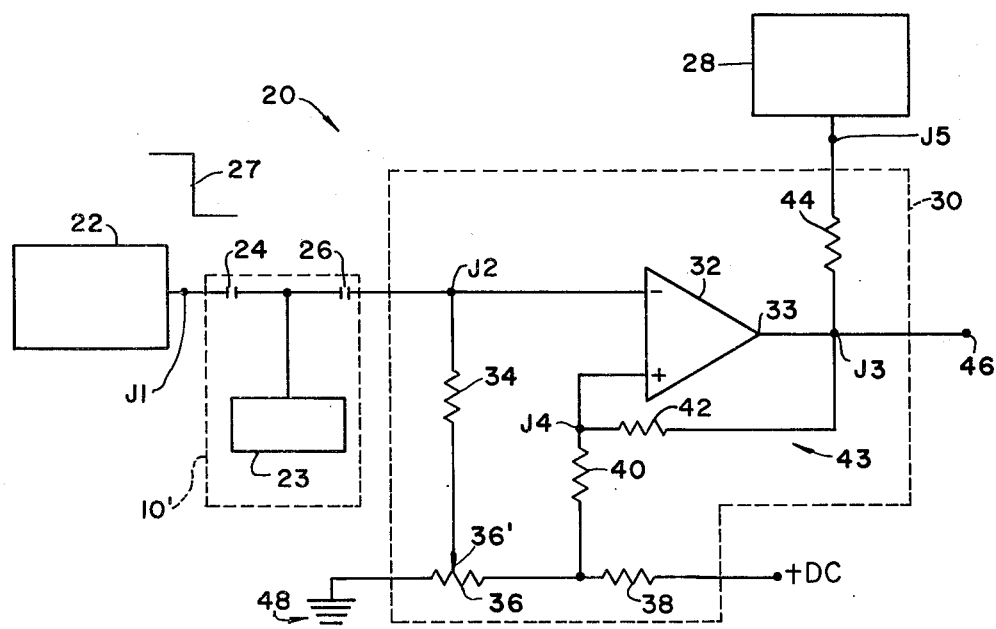
FIG. 2 is a schematic illustration of a touch control system including a first embodiment of the improved detection means of the present invention.

Referring now to FIG. 2, a touch control system 20 is shown which includes a first embodiment of a detection means 30 constructed in accordance with the present invention. In addition to detection means 30 touch control system 20 further includes a means 22 for providing a series of electrical drive pulses, an equivalent electrical circuit 10' of the touch sensitive device 10 illustrated in FIG. 1, and a means 28 for providing a series of electrical pulses for enabling detection means 30. Each of the means 22 and 28 for providing electrical pulses may be any conventional square wave oscillator which may serve as a source for digital input signals to touch control system 20.

The equivalent electrical circuit 10' of the touch sensitive switching device 10 illustrated in FIG. 1 includes a capacitance means 24 (representative of the capacitance between the coating of the tin oxide 12 and metal strip 14 depicted in FIG. 1), a capacitance means 26 (representative of the capacitance between the coating of tin oxide 12 and metal strip 16 depicted in FIG. 1), and a shunting means 23 (representative of the coating of tin oxide 12 depicted in FIG. 1). As shown, capacitance means 24 is electrically coupled to square wave oscillator 22 at junction J1 and to capacitance means 26. Capacitance means 26 is in turn electrically coupled to detection means 30 at junction J2. Shunting means 23 is electrically coupled to both capacitance means 24 and capacitance means 26 whereby the electrical signal provided by oscillator 22 is effectively shunted to ground potential as it passes through capacitance means 14 when shunting means 23 is physically touched.

The improved detection means 30 of my invention includes a conventional high gain differential comparator 32 of the type manufactured by National Semiconductor and identified by the number LM2901. The negative (−) input of the comparator 32 is electrically coupled to the touch sensitive device 10' at junction J2 and therefore is responsive to the electrical signal transmitted by capacitance means 24 and 26. The positive (+) input of the comparator 32 is electrically coupled through a resistor 40 to a voltage divider network consisting of a potentiometer 36 and a resistor 38. The voltage divider network is coupled across a DC power supply source having a positive side (+DC) and a negative side 48. The wiper 36' of the potentiometer 36 is electrically coupled through a resistor 34 to the touch sensitive device 10' at junction J2 such that by setting the potentiometer 36 a threshold voltage is established for comparator 32 which allows comparator 32 to discriminate between touch and no-touch conditions of touch sensitive device (10'). The output 33 of comparator 32 is electrically coupled at junction J3 to a means 43 for defining a time period for at least one of the states of comparator 32. Means 43 for defining a time period includes a resistor 42 in a positive feedback loop which is electrically coupled to the positive (+) input of comparator 32 at junction J4. Output 33 of comparator 32 is in addition electrically coupled at junction J3 to the output 46 of touch control system 20 and through a resistor 44 to means 28 for providing electrical pulses for enabling detection means 30 at junction J5. The embodiment of my detection means 30 described hereinabove is responsive to the negative going edges 27 of the electrical drive pulses provided by means 22 in a manner which will be described in more detail hereinafter.

Having thus described in detail a preferred embodiment of my improved detection means 30 and the touch control system 20 for which it is adaptable, the operation of touch control system 20 and more specifically of detection means 30 will now be described. The theory of operation hereinafter described is that which is at present believed properly applicable to the embodiment described above; however, it is not intended to be limiting in nature.

Figure 3:
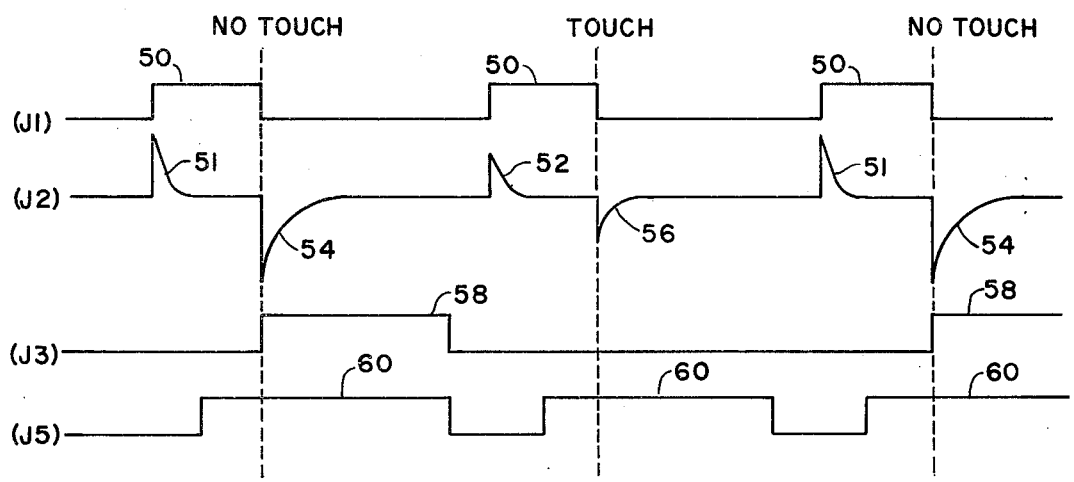
FIG. 3 and 4 are voltage waveforms taken at several locations in the touch control system illustrated in FIG. 2.

Perhaps the best way to describe the operation of touch control system 20 is to describe its operation in relation to the various voltage waveforms which appear at junctions J1, J2, J3, J4, and J5. Therefore, referring to FIGS. 2, 3, and 4, oscillator 22 supplies a square wave signal 50 (FIG. 3) to junction J1 of touch control system 20. As illustrated in FIG. 3, oscillator 28 separately supplies an enabling square wave 60 at junction J5 which when driven low forces the signal 58 at junction J3 low thereby clearing detection means 30. As shown in FIG. 3, once the signal 58 at junction J3 is forced low it remains low until a no-touch condition is detected by detection means 30 at which time a signal 58 will again appear at junction J3. Accordingly, junction J3 remains low even though junction J5 is high as long as a no-touch condition does not exist.

The magnitude of the signal transmitted from junction J1 to J2 through touch sensitive device (10') will depend upon whether the touch sensitive device (10') has been touched. When no touch contact is being made with shunting means 23 an exponentially decaying voltage spike 51 of relatively large magnitude appears at junction J2 coincidental with the positive-going edge of the square wave 50 provided by oscillator 22. Coincidental with the negative going edge 27 (FIG. 2) of square wave 50 another relatively large spike 54 of opposite polarity occurs at junction J2. When touch contact is being made with shunting means 23 a spike 52 of relatively small magnitude will appear at junction J2 coincidental with the positive-going edge of a square wave 50 provided by oscillator 22 and coincidental with the negative-going edge 27 of square wave 50 a relatively small spike 56 of opposite polarity occurs at junction J2. As previously indicated, the threshold potentiometer 36 is set such that detection means 30 discriminates between the touch and no-touch conditions of shunting means 23 based upon the magnitude of the negative spike appearing at junction J2.

Figure 4:
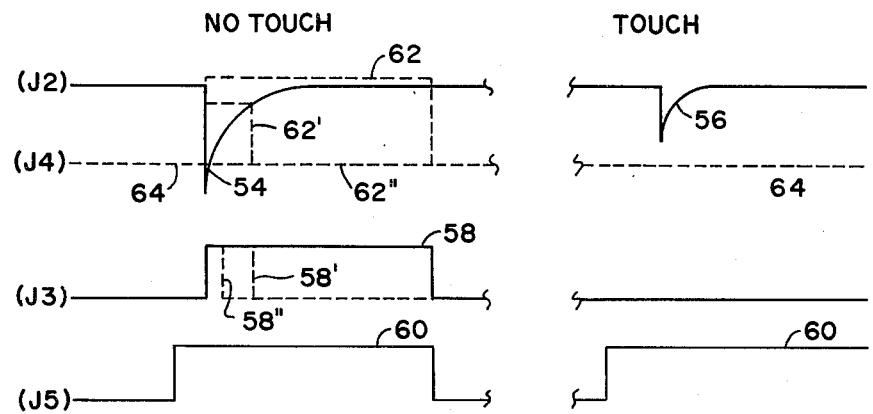

Referring specifically to FIG. 4 the manner in which detection means 30 discriminates between touch and no-touch conditions will be described. Shown in FIG. 4 is the relationship between the spikes appearing at junction J2 which are indicative of touch and no-touch conditions, the threshold or reference voltage 64 of comparator 32 appearing at junction J4, and the signal appearing at junction J3 representing both the output 33 of comparator 32 and the output 46 of touch control system 20. If the spike 54 appearing at junction J2 coincidental with the negative going edge 27 of a square wave signal 50 is of relatively large magnitude and therefore crosses the threshold voltage 64 at junction J4, comparator 32 changes states thereby allowing its output 33 to be high and producing a signal 58 at junction J3. This state of comparator 32 is indicative of a no-touch condition of touch sensitive device (10'). As further illustrated in FIG. 4, the period of time during which comparator 32 will indicate a no-touch state is determined by the magnitude of the positive feedback. A large positive feedback 62 latches detection means 30 in a no-touch state resulting in a signal 58 at junction J3 of long duration which may be detected at any subsequent time as an indication of no-touch. This no-touch state of comparator 32 will be maintained indefinitely until the voltage at junction J5 is forced low by square wave signal source 28. Accordingly, the touch control system 20 may be sampled asynchronously with the drive signal 50 (FIG. 3). A small amount of positive feedback 62' results in a signal 58' at junction J3 of a longer duration than if no positive feedback is used. No positive feedback 62" results in a signal 58" at junction J3 which is of very short duration (probably too short to be properly recognized by an external control system which operates synchronously). Accordingly, the touch control system 20 may also be sampled synchronously with the drive signal 50 by using the proper amount of positive feedback to obtain the desired pulse widths of the signal at junction J3 which are compatible with the remainder of the control system.

Continuing to refer to FIG. 4, if the spike 56 appearing at junction J2 coincidental with the negative-going edge 27 of a square wave 50 is of a relatively small magnitude and therefore does not cross the threshold voltage 64 at junction J4, comparator 32 does not change states leaving the output 33 of comparator 32 at a low voltage which appears at junction J3. This state of comparator 32 is indicative of a touch condition of touch sensitive device (10').

Figure 5:
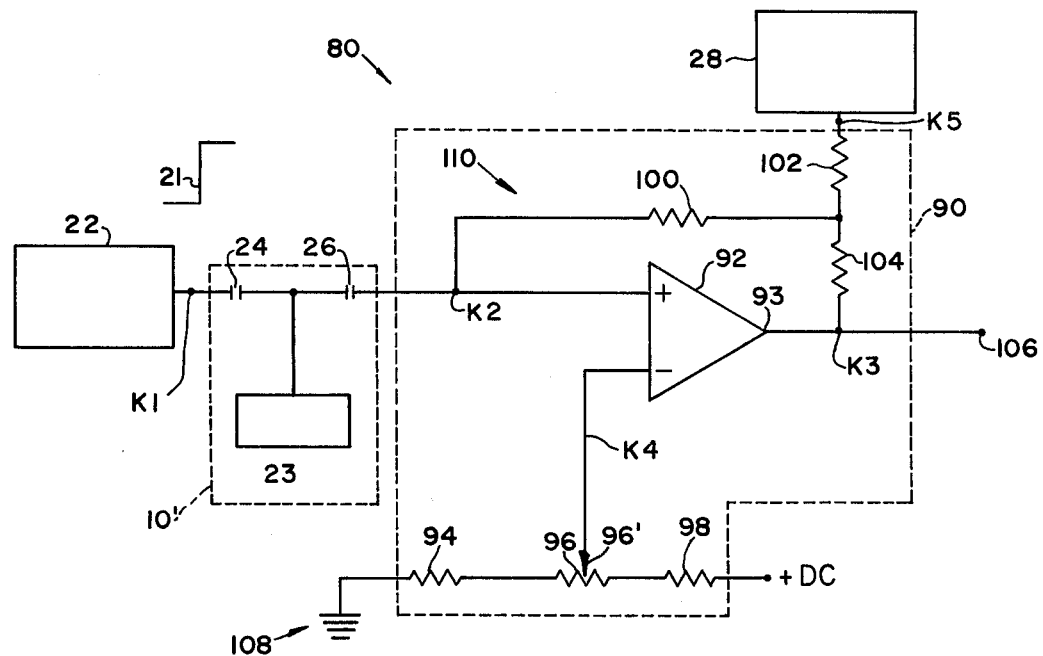
FIG. 5 is a schematic illustration of a touch control system including a second embodiment of the improved detection means of the present invention.

Referring now to FIG. 5, a touch control system 80 is shown which includes a second embodiment of a detection means 90 constructed in accordance with the present invention. In addition to detection means 90 touch control system 80 further includes a means 22 for providing a series of electrical drive pulses of the type previously described in FIG. 2, an equivalent electrical circuit 10' of the touch sensitive device 10 illustrated in FIG. 1, and a means 28 for providing a series of electrical pulses for enabling detection means 90 also of the type previously described in FIG. 2. Each of the means 22 and 28 and the equivalent circuit 10' are identical to the corresponding elements shown in FIG. 2; accordingly, the same identifying numerals have been used to identify these elements in FIG. 5.

The improved detection means 90 of my invention includes a conventional high gain differential comparator 92 of the type previously described in FIG. 2. The positive (+) input of the comparator 92 is electrically coupled to the touch sensitive device (10') at junction K2 and therefore is responsive to the electrical signal transmitted by capacitance means 24 and 26. The negative (−) input of comparator 92 is electrically coupled through the wiper 96' of a potentiometer 96 to a voltage divider network consisting of resistors 94 and 98 and potentiometer 96. The voltage divider network is coupled across a DC power supply source having a positive side (+DC) and a negative side 108. By setting the potentiometer 96 a threshold or reference voltage is established along line K4 for comparator 92 which allows comparator 92 to discriminate between touch and no-touch conditions of touch sensitive device (10'). The output 93 of comparator 92 is electrically coupled at junction K3 through a resistor 104 to a means 110 for defining a time period for at least one of the states of comparator 92. Means 110 for defining a time period includes a resistor 100 in a positive feedback loop which is electrically coupled to the positive (+) input of comparator 92 at junction K2. Output 93 of comparator 92 is in addition electrically coupled at junction K3 to the output 106 of touch control system 80 and through resistors 102 and 104 to means 28 for providing electrical pulses for enabling detection means 90 at junction K5. As illustrated in FIG. 5, this embodiment of my detection means 90 is responsive to the positive going edge 21 of the electrical drive pulses provided by means 22.

With the exception of the polarities of the various waveforms appearing at junctions K1, K2, K3, K4, and K5, the operation of touch control system 80 is identical to the operation of touch control system 20 described hereinabove. Accordingly, for a detailed description of the operation of touch control system 80 reference is made to the above described operation of touch control system 20.

In view of the above description of the embodiments of my invention it will be seen that the several objects of my invention are achieved and other advantageous results attained and that further modifications can be made without departing from the spirit and scope of my invention as defined in the appended claims.

What we claim is:

1. In a touch control system of the type including at least one touch sensitive device which capacitively transmits a relatively large electrical signal when not touched and transmits a relatively small electrical signal when touched and means responsive to said electrical signal for detecting said touch and no-touch conditions of said touch sensitive device, the improvement wherein said detection means comprises: means for comparing voltages of said electrical signals to a predetermined reference voltage, said comparing means assuming at least two states indicative to touch and no-touch conditions of said touch sensitive device, and means responsive to said comparing means for controllably defining a time period for at least one of said states of said comparing means.

2. The touch control system as recited in claim 1 wherein said state of said comparing means which is indicative of said no-touch condition of said touch sensitive device has a time period established by said defining means.

3. The touch control system as recited in claim 2 wherein said defining means includes means for providing a desired magnitude positive feedback to said comparing means.

4. The touch control system as recited in claim 3 wherein said state indicative of a no-touch condition of said touch sensitive switching device is assumed by said comparing means when a voltage of said electrical signals exceeds said predetermined reference voltage.

5. The touch control system as recited in claim 4 wherein a sufficiently high positive feedback latches said comparing means in said state indicative of a no-touch condition of said touch sensitive device when said voltage of said electrical signals exceeds said predetermined voltage whereby said touch control system is operable asynchronously.

6. The touch control system as recited in claim 4 wherein a relatively low positive feedback establishes a time period for said no-touch state of said comparing which is dependent upon said positive feedback when said voltage of said electrical signals exceeds said predetermined reference voltage whereby said touch control system is operable synchronously.

7. The touch control system as recited in claim 4 wherein said state indicative of a touch condition of said touch sensitive device is assumed by said comparing means when said voltage of said electrical signals is within said predetermined reference voltage.

8. The touch control system as recited in claim 1 wherein said means for comparing a voltage of said electrical signals to a predetermined reference voltage is a comparator having a high voltage gain whereby the magnitude of an electrical drive pulse for said control system is relatively small.

9. The touch control system as recited in claim 8 wherein said high voltage gain of said comparator allows multiplexing of a plurality of touch sensitive devices to said detection means utilizing a relatively small drive pulse voltage.

10. A method of detecting a touch condition of at least one touch sensitive device of a touch control system comprising the steps of: comparing a voltage of an electrical signal capacitively transmitted by said touch sensitive device to a predetermined reference voltage, assuming a state indicative of a no-touch condition of said touch sensitive device when said voltage of said electrial signal exceeds said predetermined reference voltage, assuming a state indicative of a touch condition of said touch sensitive device when said voltage of said electrical signal is within said predetermined reference voltage, and controllably defining a time period for said assumed state which is indicative of said no-touch condition of said touch sensitive device.

11. The method as recited in claim 10 wherein said step of controllably defining said time period includes the step of providing a sufficiently high positive feedback signal when assuming said state indicative of said no-touch condition of said touch sensitive device whereby said touch control system is operable asynchronously.

12. The method as recited in claim 10 wherein said step of controllably defining said time period includes the step of providing a relatively low positive feedback signal when assuming said state indicative of said no-touch condition of said touch sensitive device whereby said touch control system is operable synchronously.

13. The method as recited in claim 10 wherein said state indicative of said no-touch condition of said touch sensitive device is assumed when said voltage of said electrical signal exceeds said predetermined reference voltage.

14. The method as recited in claim 13 wherein said state indicative of said touch condition of said touch sensitive device is assumed when said voltage of said electrical signal is within said predetermined reference voltage.

* * * * *